(12) United States Patent
Van Gorp et al.

(10) Patent No.: US 8,027,795 B2
(45) Date of Patent: Sep. 27, 2011

(54) LOAD MODEL GENERATION FOR ESTIMATING A LOAD VALUE FROM A BASE LOAD VALUE IN A SYSTEM

(75) Inventors: John C. Van Gorp, Sidney (CA); Shaun M Hope, Alameda, CA (US); Peter Cowan, Victoria (CA); Matthew Stanlake, Victoria (CA)

(73) Assignee: Power Measurement Ltd., Saanichton, British Columbia (CA)

( * ) Notice: Subject to any disclaimer, the term of this patent is extended or adjusted under 35 U.S.C. 154(b) by 633 days.

(21) Appl. No.: 12/125,459

(22) Filed: May 22, 2008

(65) Prior Publication Data

US 2009/0292486 A1   Nov. 26, 2009

(51) Int. Cl.
*G01R 21/00* (2006.01)
*G01F 11/30* (2006.01)
*G21C 17/00* (2006.01)

(52) U.S. Cl. ............... 702/60; 702/13; 702/57; 702/61; 702/62; 702/66; 702/182; 702/189; 703/6; 703/13; 703/18

(58) Field of Classification Search ............ 702/60, 702/61, 62, 66, 57, 182, 189; 703/6, 13, 703/18
See application file for complete search history.

(56) References Cited

U.S. PATENT DOCUMENTS

| | | | |
|---|---|---|---|
| 6,134,511 A | 10/2000 | Subbarao | |
| 6,789,620 B2 * | 9/2004 | Schultz et al. | 166/250.15 |
| 2001/0044698 A1 * | 11/2001 | Kim | 702/6 |
| 2006/0291332 A1 * | 12/2006 | Szajnowski | 367/127 |
| 2008/0234935 A1 * | 9/2008 | Wolf et al. | 701/216 |
| 2009/0089009 A1 * | 4/2009 | Miller | 702/179 |

OTHER PUBLICATIONS

Lunneberg, Thomas A. et al., "Improving Simulation Accuracy Through the Use of Short-Term Electrical End-Use Monitoring".

* cited by examiner

*Primary Examiner* — Mohamed Charioui
*Assistant Examiner* — Janet Suglo

(57) ABSTRACT

A method and system for establishing a load model (120) that utilizes a measurement from a second monitor (140) to estimate a value taken by a first monitor (150). A base load value associated with a load (160) is collected. The load model (120) is applied to the base load value, yielding an estimated load value. The estimated load value is representative of at least one measured load value for the load (160).

16 Claims, 6 Drawing Sheets

LOAD MODEL GENERATION FOR ESTIMATING A LOAD VALUE FROM A BASE LOAD VALUE IN A SYSTEM

FIELD OF THE INVENTION

This invention relates to monitoring and measuring energy usage, including, but not limited to, generating a load model for use by a first monitor and based at least in part on a measurement from a second monitor.

BACKGROUND OF THE INVENTION

In a typical energy monitoring system, a monitoring device of revenue-grade accuracy is required to measure energy generation or energy usage points. A monitoring device of this caliber is often set up to measure all three phases of power and produces a multitude of different measured values. Monitoring devices of this type tends to be quite expensive and require a fairly intensive installation process, which may require the power system to be taken off-line for a period of time. Overall system size further adds to monitoring costs, because energy monitoring and distribution systems are growing in size, resulting in systems with a large number of monitoring devices.

SUMMARY OF THE INVENTION

A method and system that include establishing a load model that utilizes a measurement from a permanent monitor to estimate a value taken by a temporary monitor and measuring at least one base load value associated with a load. The load model is applied to the at least one base load value, yielding at least one estimated load value. The at least one estimated load value is representative of at least one measured load value for the load.

DETAILED DESCRIPTION

The following describes a system and method of estimating measured load values using model generated values. One or more measurements are taken from a more complex and/or highly accurate monitor, such as an expensive revenue-grade monitor. A load model is generated from at least these measurements, such that the load model and an alternate monitor, which may be less complex, expensive and/or accurate, are used to estimate load values.

Figure 1:
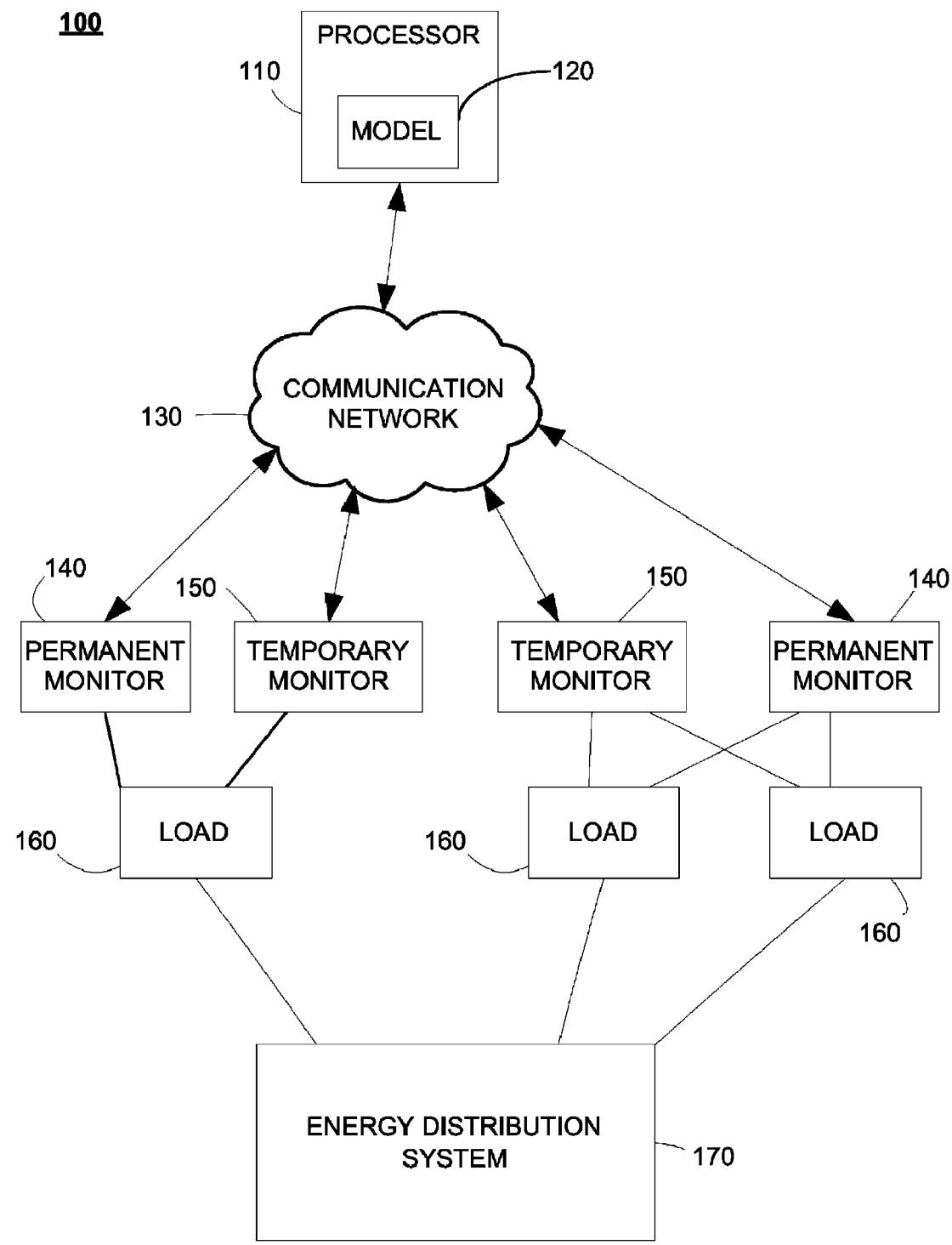
FIG. 1 is a block diagram of a system including permanent and temporary monitors in accordance with the invention.

A block diagram of a system 100 including permanent and temporary monitors is shown in FIG. 1. The system 100 includes a processor 110 that includes a load model 120. The processor 110 may be part of a server, personal computer, monitor, or other computing device, or multiple such devices alone or in combination. The load model 120 is stored in memory, in a program, and/or on a computer-readable medium such as a compact disk, DVD, floppy disk, or portable memory device, as known in the art. A permanent monitor 140 may include the processor 110, and the load model 120 may be part of the permanent monitor's program.

The system 100 also includes at least one permanent monitor 140 at least one temporary monitor 150 and at least one load 160. One or more loads 160 may be included, for example, motors, heating, ventilation and air conditioning units (HVAC), lighting, and piped loads such as water, gas, air, steam and electricity. The load 160 is connected to an energy distribution system 170. The energy distribution system 170 may be an electrical power system within an industrial plant or building, a steam distribution system within a factory, or chilled water loop within a production facility.

The permanent monitors 140 and the temporary monitors 150 communicate with the processor 110 via a communication network 130. The communication network 130 may include public and/or private communication channels/networks, the internet, an intranet, an extranet, and/or any other network configuration, which network 130 may utilize wired and/or wireless communication media. Alternatively, the processor 110 may be directly coupled to or part of the temporary monitors 150 and/or the permanent monitors 140 (not shown).

A monitor, permanent or temporary, is a device capable of at least one of recording and measuring the values of an energy system. Such values may be power events, power quality events, current, voltage, demand, energy, waveforms, harmonics, transients and other power disturbances. Examples of such devices are power meters, trip units, relays, and motor control units.

The permanent monitor 140 is advantageously equipped with the ability to capture basic load measurements, such as current and voltage. The permanent monitor 140 may be an existing device, and may have been originally connected to a load for a reason other than capturing basic measurements. The permanent monitors 140 may be, for example, one or more or a combination of variable speed drives, trip units, relays, motor control units, and/or programmable logic controllers. The permanent monitor 140 may be newly connected for its ability to capture basic measurements. Because the permanent monitor(s) 140 is(are) either already existing or capable of capturing the more basic measurements, installation is typically simple and noninvasive. The system 100 may not need to be taken off line in order to couple the permanent monitors 140 to the load, helping to reduce the overall cost. The use of a permanent monitor 140 that is simple may alleviate the need to permanently install more complex devices, such as current transformers (CT). CT installation typically requires the removal of cables to thread them through the CT, which is a complex and costly installation process.

The temporary monitor 150 may be a portable or non-permanent device that is easily coupled to the load 160. Coupling may be achieved, for example, by a non-intrusive clamp-on CT that does not require complex disconnect switches for installation. The temporary monitor 150 is advantageously capable of monitoring more advanced measurements that the permanent monitor 140 is not capable of. Such measurements include, for example, kilowatt demand, power factor, kilowatt-hour, or three-phase voltage/current. The temporary monitor 150 may also be more accurate at taking basic measurements than the permanent monitor 140. Because the temporary monitor 150 has increased measurement capabilities, it may be a higher cost item than the permanent monitor 140. Attaching the more expensive meter on a temporary basis and leaving the lower-cost permanent monitor 140 in place on an ongoing basis reduces the overall system cost. The temporary use of the temporary monitor 150 may be a service provided by a third party. Because the temporary monitor 150 is generally used on a temporary basis, the user pays for the use of the higher cost temporary monitor 150 for a short period of time, for example, under a lease, rental, or part of an overall package deal.

The permanent monitor 140 is coupled to the load 160. The permanent monitor 140 measures base load values of the load 160 that is attached to the energy distribution system 170. These base load values are measurements of at least one energy-related parameter, such as voltage, current, frequency, kWh, and the like. Once the load model 120 has been established, the load model 120 receives base load values and generates estimated load values. The temporary monitor 150 is coupled to the same load 160 as the permanent monitor 140 and simultaneously monitors temporary load values. The temporary and base load values captured simultaneously are used to generate the load model 120. The permanent monitor 140 and the temporary monitor 150 communicate the base load values and the temporary load values, respectively, to the processor 110 directly or over the communication network 130, as appropriate.

Figure 2:
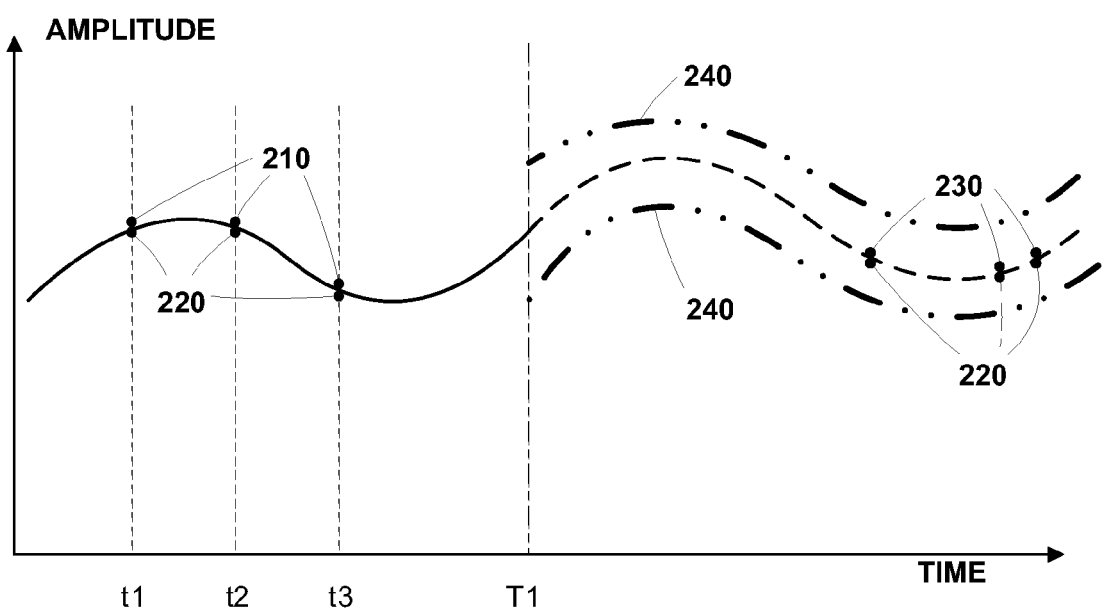
FIG. 2 is a graph of a measured load value that is directly measured and estimated in accordance with the invention.

A graph of load values that are directly measured and estimated is shown in FIG. 2. Before time T1, the temporary monitor 150 is coupled to the load 160 and measures the temporary load values 210. Before time T1, the permanent monitor 140 is coupled to the load 160 and measures the base load values 220. The temporary load values 210 and base load values 220 are measured at substantially the same time, as shown at times t1, t2, and t3 in FIG. 2. After T1, the temporary monitor 150 is no longer connected to the load 160, and estimated load values 230 are generated by applying a load model, described below, to base load values 220 taken by the permanent monitor 140.

As shown in FIG. 2, an estimation range 240 surrounds the estimated load values 230 and provides a span within which the estimated load values 230 approximate the temporary load values 210. By way of example, if one of the estimated load values 230 is 135 kWh and the estimation range 240 is 10 kWh, then the corresponding temporary load value 210 would likely have fallen within the range 130 kWh to 140 kWh had it been measured beyond T1. The estimation range 240 may be generated for the load model 120 by the processor 110. The method used to determine the estimation range 240 may be based on the method used to determine the load model 120, which is described in more detail below. One method of determining the estimation range 240 is to determine a confidence interval, as known in the art, for the estimated load values 230 generated by the load model 120.

Figure 3:
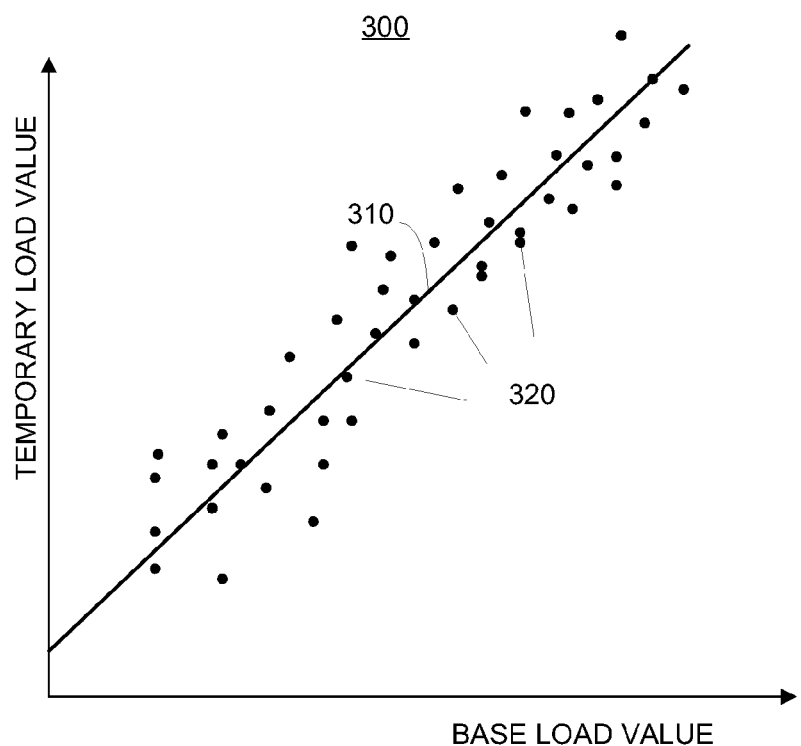
FIG. 3 is an example of a linear regression model of estimating load values in accordance with the invention.

FIG. 3, FIG. 4, FIG. 5, and FIG. 6 each show different examples of statistical analysis methods applied to determine a correlation between the base load values from the permanent monitor 140 and the temporary load values from the temporary monitor 150. A linear regression 300 is shown in FIG. 3, in which a line 310 represents the relationship between the temporary load values and the base load values. Points 320 represent a graph of temporary load values 210 vs. base load values 220. The line 310 represents a linear relationship between the temporary load values 210 and the base load values 220. The linear equation is typically of the form $y=mx+b$ and has an associated correlation coefficient $R^2$.

Figure 4:
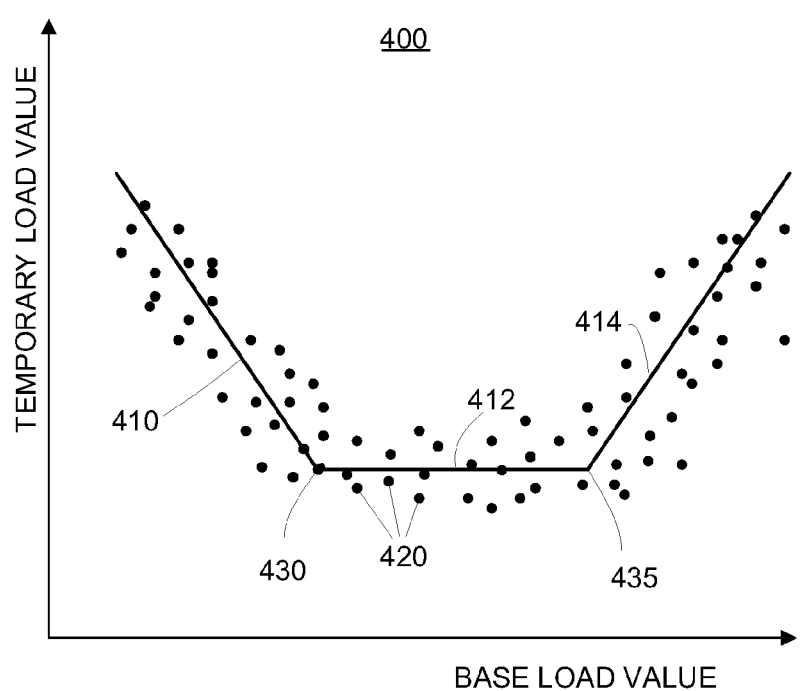
FIG. 4 is an example of a segmented regression model for estimating load values in accordance with the invention.

A segmented regression 400 that has 3 linear segments 410, 412, and 414 separated by breakpoints 430 and 435 is shown in FIG. 4. Each of the segments 410, 412, and 414 represents groups of points 420 that have a linear relationship, although the entire plot 400 does not reflect a single linear relationship. Breakpoints 430 and 435 show where the relationship between the values changes. These breakpoints may represent, for example, a change in operation of the load being monitored. For example, for an HVAC unit, the first breakpoint 430 and the second breakpoint 435 may represent temperature set points at which the HVAC unit switches operating modes. Before the first breakpoint 430, heat is provided. After the first breakpoint 430 and before the second breakpoint 435, neither heating nor air conditioning is provided. After the second breakpoint 435, air conditioning is provided.

Figure 5:
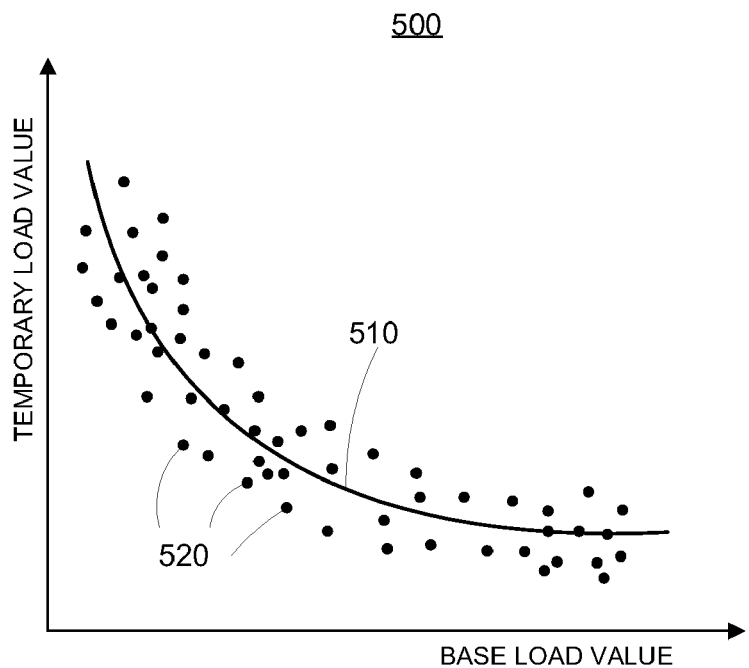
FIG. 5 is an example of a non-linear regression model for estimating load values in accordance with the invention.

A nonlinear regression 500 with a curve 510 representing the points 520 is shown in FIG. 5. Points 520 represent a graph of temporary load values 210 vs. base load values 220. The curve 510 represents a nonlinear relationship between the temporary load values 210 and the base load values 220.

Figure 6:
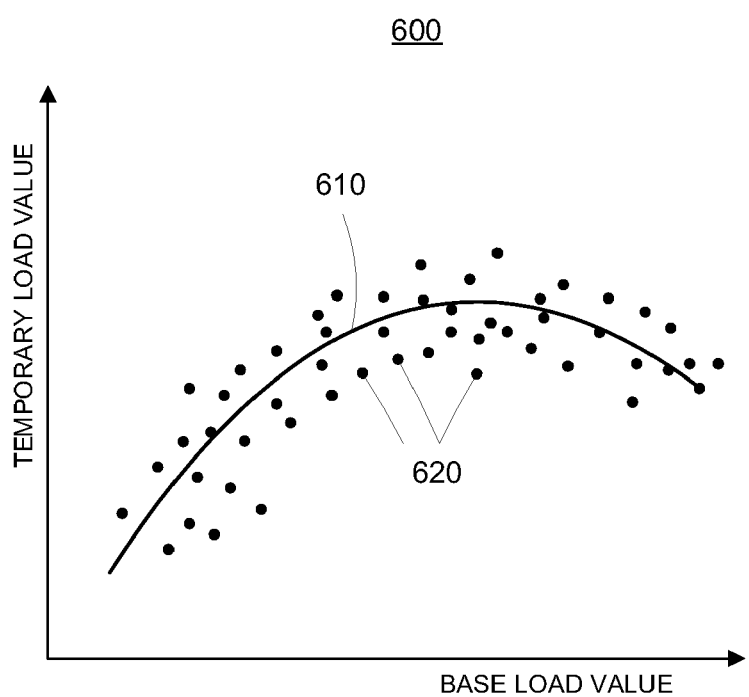
FIG. 6 is an example of a polynomial regression model for estimating load values in accordance with the invention.

A polynomial regression 600 with a curve 610 representing the points 620 is shown in FIG. 6. Points 620 represent a graph of temporary load values 210 vs. base load values 220. The curve 610 represents the relationship between the temporary load values 210 and the base load values 220.

Figure 7:
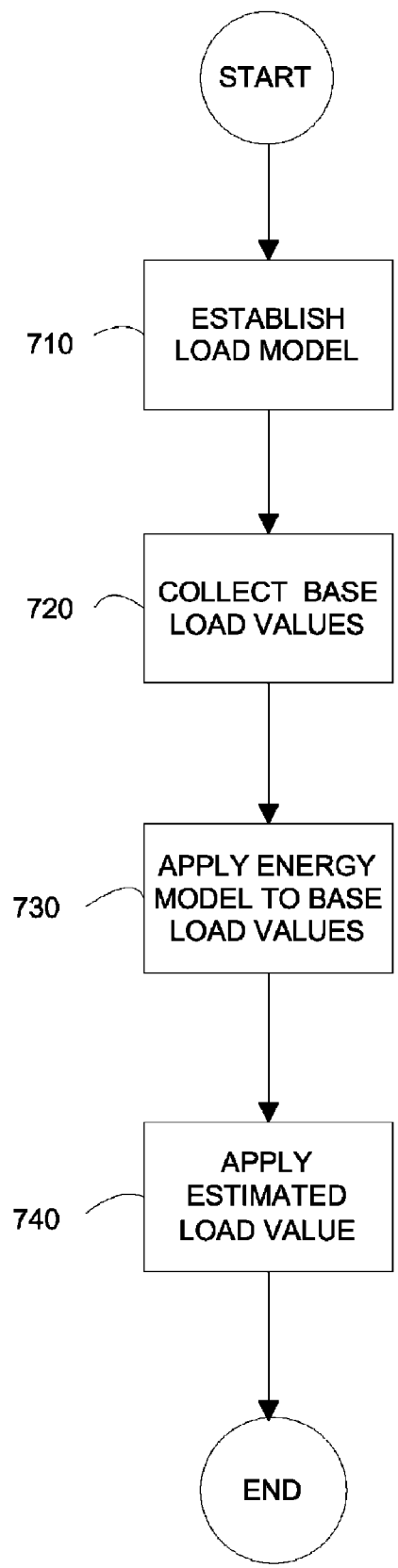
FIG. 7 is a flowchart showing a method of generating an estimated load value in accordance with the invention.

A flowchart illustrating a method of generating an estimated load value 230, as may be performed by the processor 110, is shown in FIG. 7. The processor 110 generates the load model 120. At step 710, a load model 120 is established, as set forth in the flowchart of FIG. 8 and its associated text below. At step 720, the base load values 220 are collected from the permanent monitor 140 that measures the base load values 220. The load model 120 established at step 710 is applied to the base load values 220 at step 730, yielding estimated load values 230. Optionally, an indication may be provide when an exception occurs; for example, when a value is requested that is beyond the range of the load model 120, although an estimated load value 230 may be provided through extrapolation of the load model 120. At step 740, the estimated load values 230 are applied, for example, in the same way(s) as directly measured load values may be applied.

Estimated load values 230 may be applied in multiple ways. Estimated load values 230 may be generated at regular time intervals and shown on a display located near the load 160 to which the estimated load values 230 apply. The estimated load values 230 may also be stored in memory on the permanent monitor 140 and retrieved as required. The estimated load values 230 may be provided to a local or remote control center (not shown) via the communication network 130. The estimated load values 230 may be applied to adjust or control the power system or issue status messages or warnings. For example, the estimated load value 230 may be compared to a predetermined value or threshold. If the estimated load value 230 is found to be beyond the predetermined value or threshold, an alarm is triggered. The estimated load values 230 may be utilized by information and automation systems for historical, current, and forecasting purposes. Such a system is the ION® Enterprise Energy Management system available from Power Measurement Limited, Saanichton, British Columbia, Canada.

Figure 8:
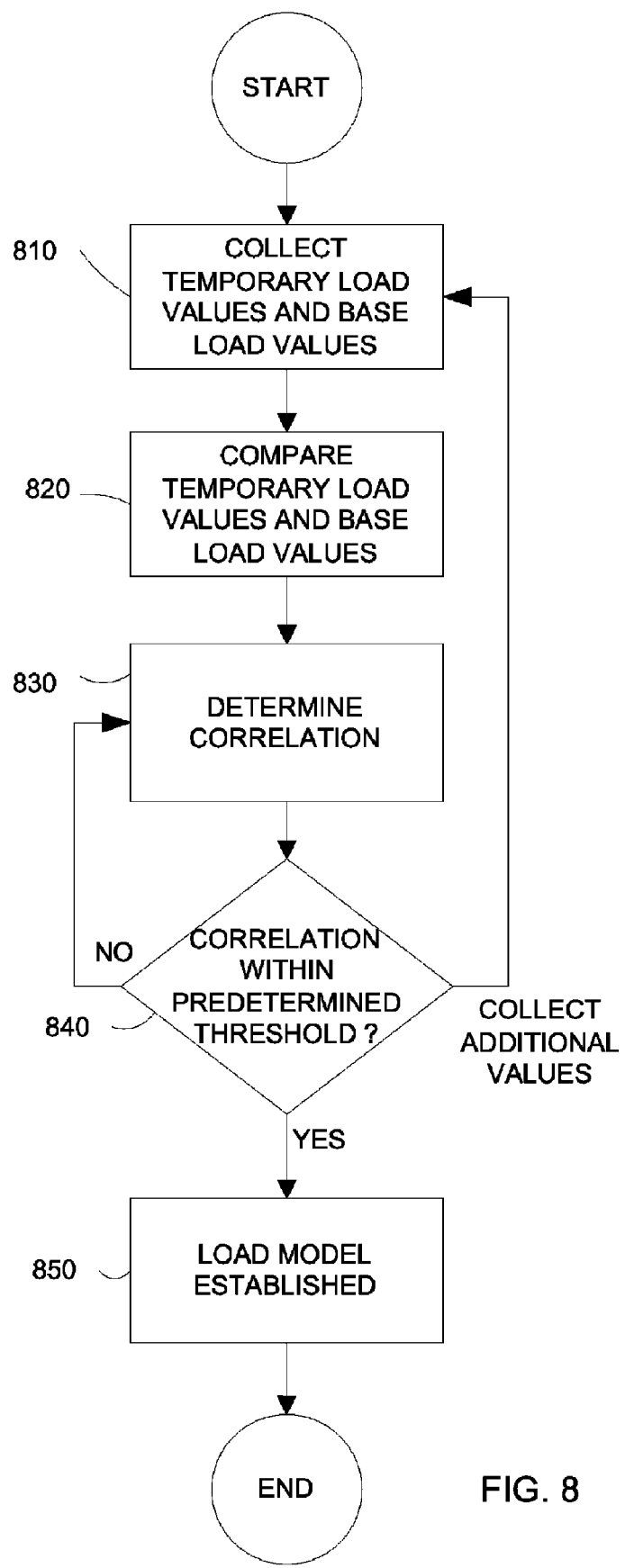
FIG. 8 is a flowchart showing a method of establishing a load model in accordance with the invention.

A flowchart illustrating a method of establishing a load model 120 is shown in FIG. 8. At step 810, base load values 220 taken by the permanent monitor 140 and temporary load values 210 taken by the temporary monitor 150 are collected. Measured values are advantageously captured substantially synchronously by the permanent monitor 140 and the temporary monitor 150. The degree of synchronization depends on how rapidly base load values vary. In general, the delay between measurements of the temporary monitor 150 and measurements of the permanent monitor 140 advantageously is less than the frequency of substantial variations in base load values 220 for a particular load 160. The permanent monitor 140 and the temporary monitor 150 may be initially or periodically synchronized in time by the processor 110 through commands or time stamp messages and the monitors may take measurements at the same time intervals thereafter. A separate processor, such as in a Global Positioning Satellite receiver, may be used as the time source for synchronization. Alternatively, either the permanent monitor 140 or the temporary monitor 150 is set up as a master and the other as slave. When the master takes a measurement from the load 160, the master sends a trigger to the slave device to take a measurement from the load 160.

The temporary monitor 150 and the permanent monitor 140 continue to measure their respective values until an adequate number of load values are collected to establish a load model 120. Both temporary load values 210 and base load values 220 are collected over as much of the full operational range of the load 160 as possible. By way of example, a building cooling system may only experience its full operational range between spring and fall seasons. The load model 120 is more accurate when both temporary load values 210 and base load values 220 are collected over an entire cooling season. In another example, an electrical motor used in a production process may experience its full operational range over the course of one production shift, and a sufficient number of temporary load values 210 and base load values 220 may be collected over the course of one production shift to build the load model 120.

Once enough base load values 220 and temporary load values 210 have been captured by the permanent monitor 140 and the temporary monitor 150 respectively, the process continues with step 820, where the base load values 220 are compared to the temporary load values 210. In one embodiment, the comparison utilizes synchronized load values, i.e., a base load value 220 and a temporary load value 210 taken at the same time are compared. This comparison is used at step 830, where a correlation is determined between the temporary load values 210 captured by the temporary monitor 150 and the base load values 220 captured by the permanent monitor 140. Statistical analysis may include, for example, linear regression, nonlinear regression, segmented regression, polynomial regression, and any other applicable statistical analysis methods that determine a correlation between two or more sets of values. Graphical examples of various regressions are shown in FIG. 3 through FIG. 6. More than one type of correlation analysis may be performed.

Optionally, known characteristics of a load 160 may be utilized to select the statistical analysis method employed or to supplement the development of a load model 120. For example, a characteristic curve of the load 160 may be utilized as a part of the load model 120. Pre-defined load models, such as one provided by the manufacturer of the load 160, may be utilized to assist the correlation analysis process, to supplement the load model 120, and/or to reduce the time to generate the load model 120.

At step 840, it is determined whether the correlation of step 830 meets a predetermined threshold of acceptance for the load model 120. If, for example, a linear regression is applied, the correlation coefficient is 0.98 (or 98%), and a correlation coefficient above 95% is acceptable, the load model 120 is established at step 850. If the correlation coefficient of the linear regression is 0.92 (or 92%), the 95% threshold is not met, and the process continues with step 830 to attempt to determine a different correlation between the values. Alternatively, the process may continue instead with step 810, to collect additional temporary load values 210 and base load values 220. Utilizing additional values may lead to a stronger correlation coefficient. Optionally, a user may intercede in the process to review one or more correlations and/or load models before manually selecting a load model 120. An estimation range 240, may optionally be determined for the load model 120, as described above. Collecting additional temporary load values 210 and base load values 220 will typically result in a smaller estimation range 240.

The present invention provides the following advantages. The load model generation for estimating a load value from a base load value in a system is a less expensive and complex means of monitoring loads to be used in place of more expensive monitoring equipment so that the pertinent information is directly measured with acceptable accuracy and other information is approximated. An approach such as described herein is highly beneficial because of lower equipment and installation costs while still providing the necessary information. Typically, there are multiple load points in energy systems that do not require the full breadth of available measurements or the high level of accuracy provided by revenue grade meters. A user may only need a small subset of basic measurements such as current and voltage, captured with an acceptable level of accuracy. Other measurements, such as kilowatt hours or kilowatt demand, may not be vital to daily system functions, but an approximation of these values may be of interest. Different monitoring applications have different accuracy requirements. For example when monitoring to show an expected 10% in energy savings, a monitoring system with an accuracy of 1% may be sufficient. Alternatively, some loads types have two basic functioning levels, on and off. When they are on, the load operates within a set range. When monitoring loads of this type, very little accuracy is required.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A system comprising:
a processor;
a permanent monitor operably coupled to a load connected to an energy distribution system, wherein the permanent monitor produces base load values indicative of an energy-related parameter associated with the load and transmits the base load values to the processor, the base load values being collected over a period of time sufficient to capture an operational range of the load;
a temporary monitor operably coupled to the load, wherein the temporary monitor produces, at substantially the same time as the permanent monitor, temporary load values indicative of the energy-related parameter or a different energy-related parameter associated with the load and transmits the temporary load values to the processor, the temporary load values being collected over the period of time without having to disconnect the load from the energy distribution system, and wherein each of the permanent monitor and the temporary monitor is configured to measure values of the energy distribution system to produce the base load values and the temporary load values, respectively, the temporary monitor being capable of monitoring (a) more advanced measurements of the value than the permanent monitor is capable of or (b) more accurate measurements of the value relative to the permanent monitor;

wherein the processor generates at least one load model indicative of a relationship between the transmitted base load values and the transmitted temporary load values, wherein, responsive to the temporary monitor being disconnected from the load, (a) the permanent monitor produces a new base load value indicative of the energy-related parameter associated with the load and (b) the processor calculates an estimated load value based on the new base load value and the load model, wherein the load model incorporates known characteristics of the load provided by the manufacturer of the load, and wherein the processor determines a confidence interval for the estimated load value to determine an estimation range for the load model, the estimation range corresponding to a range within which the estimated load value approximates at least one of the temporary load values.

2. The system of claim 1, wherein the temporary monitor is coupled to the load for a period of time sufficient to capture an operational range of the load.

3. The system of claim 1, wherein the temporary monitor and the permanent monitor are coupled to the processor by a communication network.

4. The system of claim 1, wherein the permanent monitor and the temporary monitor are synchronized to substantially simultaneously measure the base load value and the temporary load value.

5. The system of claim 4, wherein the temporary monitor and the permanent monitor are synchronized with an external time source.

6. The system of claim 4, wherein one of the permanent monitor and the temporary monitor acts as a master device and transmits a synchronization signal.

7. A method comprising:

establishing, using a processor, a load model that utilizes a measurement of an energy distribution system from a second monitor to estimate a value taken by a first monitor operably coupled to a load connected to the energy distribution system;

collecting, using the processor, from the first monitor base load values indicative of an energy-related parameter associated with the load over a period of time sufficient to capture an operational range of the load;

collecting, using the processor, from the second monitor temporary load values indicative of the energy-related parameter or a different energy-related parameter associated with the load over the period of time without having to disconnect the load from the energy distribution system, the second monitor being capable of monitoring (a) more advanced measurements than the permanent monitor is capable of or (b) more accurate measurements relative to the permanent monitor, the base load values and the temporary load values being produced at substantially the same time;

responsive to the second monitor being disconnected from the load, collecting a new base load value indicative of the energy-related parameter associated with the load and calculating, using the processor, an estimated load value by applying the load model to the new base load value, wherein the load model incorporates known characteristics of the load provided by the manufacturer of the load;

storing the estimated load value in a memory device coupled to the processor; and determining, using the processor, a confidence interval for the estimated load value to determine an estimation range for the load model, the estimation range corresponding to a range within which the estimated load value approximates at least one of the temporary load values.

8. The method of claim 7, wherein the step of determining yields a second load model.

9. The method of claim 7, wherein the step of collecting the plurality of temporary load values and the step of collecting the plurality of the base load values are synchronized.

10. The method of claim 7, wherein the step of collecting the plurality of temporary load values and the step of collecting the plurality of the base load values is synchronized by a master monitor.

11. The method of claim 7, wherein the steps of collecting occurs over a period of time sufficient to capture an operational range of the load.

12. The method of claim 7, wherein an estimation range is determined for the load model.

13. The method of claim 7, wherein the step of establishing utilizes at least one external specification for the load.

14. The method of claim 7, wherein the step of establishing comprises utilizing a pre-defined load model.

15. The method of claim 7, wherein the load model is determined by a regression method.

16. A computer program product, comprising one or more non-transitory computer-readable media, wherein information embodied on the non-transitory computer-readable media is configured to cause a processor to implement a method comprising:

establishing a load model that utilizes a measurement of an energy distribution system from a second monitor to estimate a value taken by a first monitor operably coupled to a load connected to the energy distribution system;

collecting from the first monitor base load values indicative of an energy-related parameter associated with the load over a period of time sufficient to capture an operational range of the load;

collecting from the second monitor temporary load values indicative of the energy-related parameter or a different energy-related parameter associated with the load over the period of time without having to disconnect the load from the energy distribution system, the second monitor being capable of monitoring (a) more advanced measurements than the permanent monitor is capable of or (b) more accurate measurements relative to the permanent monitor, the base load values and the temporary load values being produced at substantially the same time;

responsive to the second monitor being disconnected from the load, collecting a new base load value indicative of the energy-related parameter associated with the load and calculating an estimated load value by applying the load model to the new base load value, wherein the load model incorporates known characteristics of the load provided by the manufacturer of the load;

storing the estimated load value in a memory device; and determining a confidence interval for the estimated load value to determine an estimation range for the load model, the estimation range corresponding to a range within which the estimated load value approximates at least one of the temporary load values.

* * * * *